(12) United States Patent
Hata

(10) Patent No.: US 8,227,829 B2
(45) Date of Patent: Jul. 24, 2012

(54) SEMICONDUCTOR LIGHT-EMITTING DEVICE

(75) Inventor: Yasunori Hata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/235,973

(22) Filed: Sep. 19, 2011

(65) Prior Publication Data

US 2012/0007124 A1 Jan. 12, 2012

Related U.S. Application Data

(63) Continuation of application No. 12/594,270, filed as application No. PCT/JP2008/056020 on Mar. 28, 2008, now Pat. No. 8,035,124.

(30) Foreign Application Priority Data

Apr. 5, 2007 (JP) .................................. 2007-099240

(51) Int. Cl.
 *H01L 33/00* (2010.01)
(52) U.S. Cl. ..................... 257/98; 257/99; 257/E33.066; 257/E33.072
(58) Field of Classification Search ........... 257/E33.066, 257/E33.072
 See application file for complete search history.

(56) References Cited

U.S. PATENT DOCUMENTS

| 6,091,084 A | 7/2000 | Fujii |
| 6,930,332 B2 * | 8/2005 | Hashimoto et al. ............. 257/98 |
| 7,128,444 B2 * | 10/2006 | Isokawa et al. .......... 362/311.02 |

FOREIGN PATENT DOCUMENTS

| JP | 55-123181 | 9/1980 |
| JP | 62-162860 | 10/1987 |
| JP | 1-167065 | 11/1989 |
| JP | 3-67459 | 7/1991 |
| JP | 2003-11415 | 1/2003 |
| JP | 2006-286837 | 10/2006 |
| JP | 2006-303184 | 11/2006 |

* cited by examiner

*Primary Examiner* — Thien F Tran
(74) *Attorney, Agent, or Firm* — Hamre, Schumann, Mueller & Larson, P.C.

(57) ABSTRACT

A semiconductor light emitting device (A) includes a semiconductor light emitting element (2) including a light emitting layer (22), a lead (1) formed with a reflector (11) that surrounds the semiconductor light emitting element (2), a light transmitting resin (4) covering the semiconductor light emitting element (2). The reflector (11) of the lead (1) includes a recess (12) at the bottom surface. The semiconductor light emitting element (2) is mounted to a bottom surface of the recess (12), with the light emitting layer (22) positioned outside the recess (12). A highly heat conductive material (3) having a thermal conductivity higher than that of the light transmitting resin (4) is loaded between the semiconductor light emitting element (2) and the recess (12).

16 Claims, 4 Drawing Sheets

US 8,227,829 B2

SEMICONDUCTOR LIGHT-EMITTING DEVICE

This application is a Continuation of U.S. Ser. No. 12/594,270 filed Oct. 1, 2009, which is a National Stage Application of PCT/JP2008/056020, filed Mar. 28, 2008, which applications, are incorporated herein by reference.

TECHNICAL FIELD

The present invention relates to a semiconductor light emitting device including a semiconductor light emitting element.

BACKGROUND ART

FIG. 5 illustrates an example of a conventional semiconductor light emitting device (See Patent Document 1, for example). The illustrated semiconductor light emitting device X includes a lead 91 and an LED chip 92 mounted on the lead. The lead 91 is formed with a recess, in which the LED chip 92 is received. The recess is defined by a flat bottom surface and a side surface 91a flaring toward the top. The LED chip 92 is bonded to the bottom surface of the recess with silver paste. The side surface 91a serves as a reflector for reflecting the light emitted from the LED chip 92. The lead 91 and the LED chip 92 are covered with light transmitting resin 94. The light transmitting resin 94 forms a lens 94a facing the LED chip 92. The LED chip 92 includes a GaAs substrate and a light emitting layer 92a formed on the GaAs substrate. The light emitted from the light emitting layer 92a travels upward directly or after the reflection at the reflector 91a and is then emitted to the outside of the semiconductor light emitting device X through the lens 94a.

The semiconductor light emitting device X has room for improvement in the following points. Firstly, because of the structure of the LED chip 92, the light emitted travels only toward the space in front of the light emitting layer 92a. Thus, the portion of the reflector 91a which is close to the bottom surface of the recess does not help the light travel toward the lens 94a, and hence, is useless. Secondly, part of the light emitted from the light emitting layer 92a is totally reflected at the surface of the light transmitting resin 94 to return to the LED chip 92. The returning light is absorbed by the. GaAs substrate of the LED chip 92, which deteriorates the light emission efficiency of the semiconductor light emitting device X. Thirdly, the luminance of the light from the LED chip 92 can be increased by increasing the input power. In this case, however, a larger amount of heat is generated at the LED chip 92. Since the LED chip 92 is covered with the light transmitting resin 94, it is difficult to properly dissipate the heat.

Patent Document 1: JP-A-2006-303184

DISCLOSURE OF THE INVENTION

The present invention has been proposed under the circumstances described above. It is, therefore, an object of the present invention to provide a semiconductor light emitting device with increased luminance.

A semiconductor light emitting device provided according to the present invention includes a semiconductor light emitting element including a light emitting layer, a lead formed with a reflector that surrounds the semiconductor light emitting element, and a light transmitting resin covering the semiconductor light emitting element. The lead includes a recess formed at a bottom surface of the reflector. The semiconductor light emitting element is mounted to a bottom surface of the recess, with the light emitting layer positioned outside the recess. A highly heat conductive material having a thermal conductivity higher than that of the light transmitting resin is loaded between the semiconductor light emitting element and the recess.

With this arrangement, almost all portions. of the reflector extending from the bottom to the top serve to reflect the light emitted from the light emitting element. Further, the heat generated at the light emitting element is properly dissipated to the lead through the highly heat conductive material. Thus, the light emission efficiency of the semiconductor light emitting element is enhanced, and the output of the semiconductor light emitting element can be increased, whereby the brightness of the semiconductor light emitting device is increased.

Preferably, the recess includes a tapered open end whose diameter in cross section increases as proceeding away from the bottom surface of the recess.

Preferably, the bottom surface of the recess is formed with a raised portion projecting toward the open end, and the semiconductor light emitting element is mounted to the raised portion.

Other features and advantages of the present invention will become more apparent from the detailed description given below with reference to the accompanying drawings.

BEST MODE FOR CARRYING OUT THE INVENTION

Figure 1:
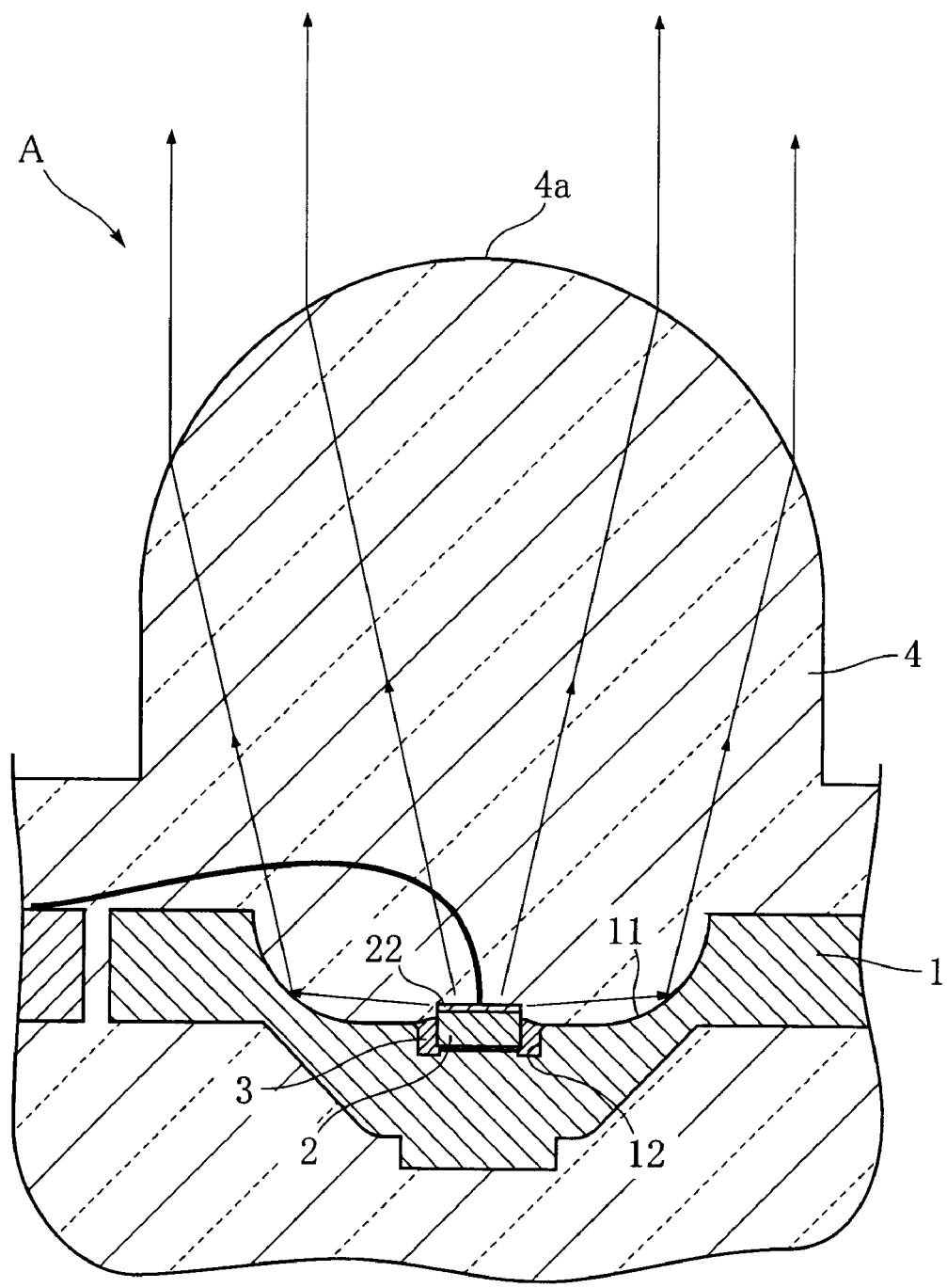
FIG. 1 is a sectional view illustrating an example of a semiconductor light emitting device according to the present invention.
Figure 2:
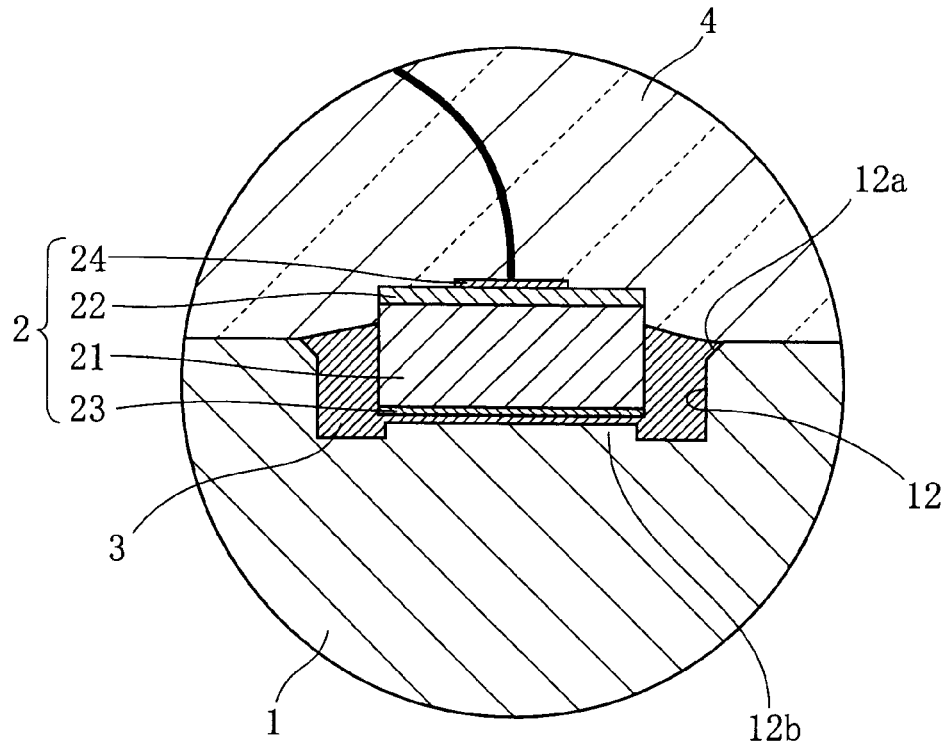
FIG. 2 is a sectional view illustrating a principal portion of the semiconductor light emitting device.
Figure 3:
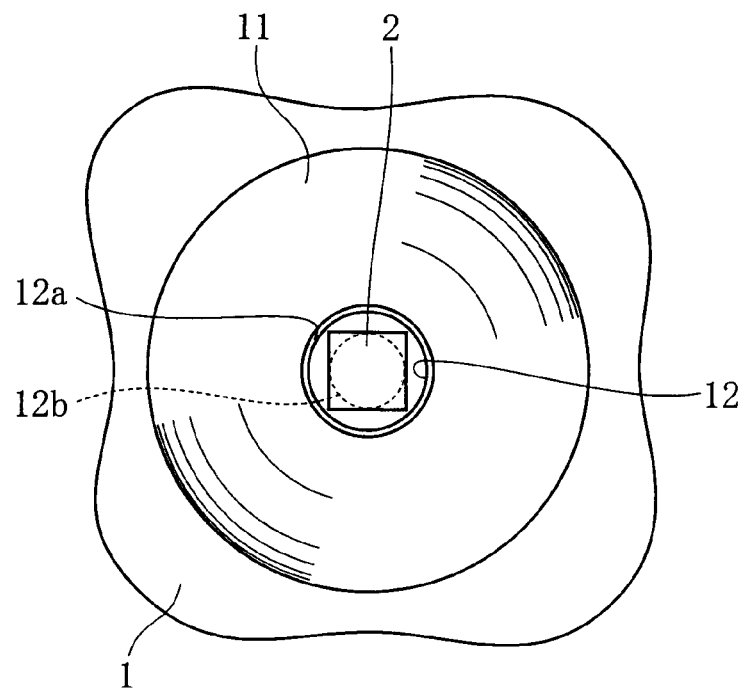
FIG. 3 is a plan view illustrating the lead and the semiconductor light emitting element of the semiconductor light emitting device.

FIGS. 1-3 illustrate an example of a semiconductor light emitting device according to the present invention. The illustrated semiconductor light emitting device A includes a lead 1, an LED chip 2 and a light transmitting resin 4. Although the semiconductor light emitting device A is designed as a bullet shaped LED device, the present invention is not limited to this.

The lead 1 is made of e.g. a Cu alloy and supports the LED chip 2. The lead is also used for supplying power to the LED chip 2. As will be understood from FIGS. 1 and 3, the lead 1 is formed with a recess defined by a wall surface 11 and having a relatively large diameter, and another recess 12 formed at the bottom center of the large-diameter recess and having a relatively small diameter. The wall surface 11 surrounds the LED chip 2 (see FIG. 3) and serves as a reflector for reflecting the light emitted laterally from the LED chip 2.

The smaller-diameter recess 12 is circular in cross section and is recessed from the bottom of the wall surface 11. As illustrated in FIG. 3, the diameter of the recess 12 is slightly larger than the length of the diagonal of the LED chip 2. As illustrated in FIG. 2, the recess 12 includes a tapered portion 12a at the top and a raised portion 12b at the bottom. Specifically, the tapered portion 12a is formed at the open end of the recess 12. In the illustrated example, the tapered portion is defined by an annular chamfer. The raised portion 12b is circular in cross section and made higher than other portions of the bottom surface of the recess 12.

The LED chip 2 is the light source of the semiconductor light emitting device A and includes a substrate 21, a light emitting layer 22, a lower electrode 23 and an upper electrode 24, as shown in FIG. 2. The substrate 21 is made of e.g. GaAs and used as a base in the process of manufacturing the LED chip 2. The light emitting layer 22 is made up of e.g. an n-type semiconductor layer, an active layer and a p-type semiconductor layer laminated on the substrate 21. Due to the recombination of holes and electrons in the light emitting layer 22, light of a predetermined wavelength (e.g. red light) is emitted. The two electrodes 23 and 24 are made of a thin metal film, and so formed that the substrate 21 and the light emitting layer 22 are sandwiched between the electrodes.

The LED chip 2 is mounted to the lead 1 with silver paste 3. The silver paste 3 contains a large amount of silver (having a relatively high thermal conductivity). As illustrated in FIG. 2, the LED chip 2 is mounted, with the lower electrode 23 facing the raised portion 12b. Of the LED chip 2, a lower portion of the substrate 21 is received in the recess 12 (i.e., positioned lower than the open end of the recess 12 in FIG. 2). On the other hand, an upper portion of the substrate 21 and the entirety of the light emitting layer 22 are positioned outside the recess 12 (i.e., positioned higher than the open end of the recess 12). The silver paste 3 fills the space between the side wall of the recess 12 and the LED chip 2 as well as the space between the electrode 23 and the raised portion 12b. The top surface of the silver paste is connected to the upper edge of the tapered portion 12a and the substrate 21 and does not reach the light emitting layer 22. The upper electrode 24 is connected, via a wire, to a second lead arranged adjacent to the lead 1 (see FIG. 1).

The light transmitting resin 4 is made of a resin which transmits light emitted from the LED chip 2, such as transparent epoxy resin, and covers the lead 1 and the LED chip 2, as illustrated in FIG. 1. The light transmitting resin 4 forms a lens 4a. The lens 4a faces the LED chip 2 and serves to enhance the directivity of the light emitted from the LED chip 2.

The advantages of the semiconductor light emitting device A are described below.

The semiconductor light emitting device A having the above-described structure has an increased luminance due to the enhanced light emission efficiency and increased output.

Specifically, most part of the substrate 21, which hardly emits light, is received in the recess 12, and the light emitting layer 22 is positioned close to the bottom of the reflector (wall surface) 11. With this arrangement, almost all portions of the reflector 11 extending from the bottom to the top serves to reflect the light from the LED chip 2 toward the lens 4a. Further, even if part of the light emitted from the LED chip 2 returns to the LED chip 2 after the total reflection at the surface of the light transmitting resin 4, the absorption of the light by the substrate 21 made of GaAs is suppressed. Thus, the light from the LED chip 2 is efficiently emitted to the outside.

Of the LED chip 2, the lower electrode 23 and most part of the substrate 21 are bonded to the lead 1 via the silver paste 3. The thermal conductivity of the silver paste 3 is considerably higher than that of the light transmitting resin 4. Thus, the heat generated at the LED chip 2 due to the lighting is efficiently dissipated to the lead 1 through the silver paste 3. This makes it possible to increase the output of the LED chip 2.

Since the light emitting layer 22 is positioned outside the recess 12, undesirable electrical conduction between the light emitting layer 22 and the silver paste 3 is prevented. Further, the provision Of the tapered portion 12a suppresses the rising of the top surface of the silver paste 3. Thus, the silver paste 3 is prevented from rising along the side surface of the substrate 21 to reach the light emitting layer 22.

By placing the LED chip 2 in the recess 12, the positioning of the LED chip 2 relative to the lens 4a is performed precisely. Specifically, the silver paste 3 intervening between the raised portion 12b and the lower electrode 23 provides centering effect, so that the position of the LED chip 2 is prevented from largely deviating from the raised portion 12b.

Figure 4:
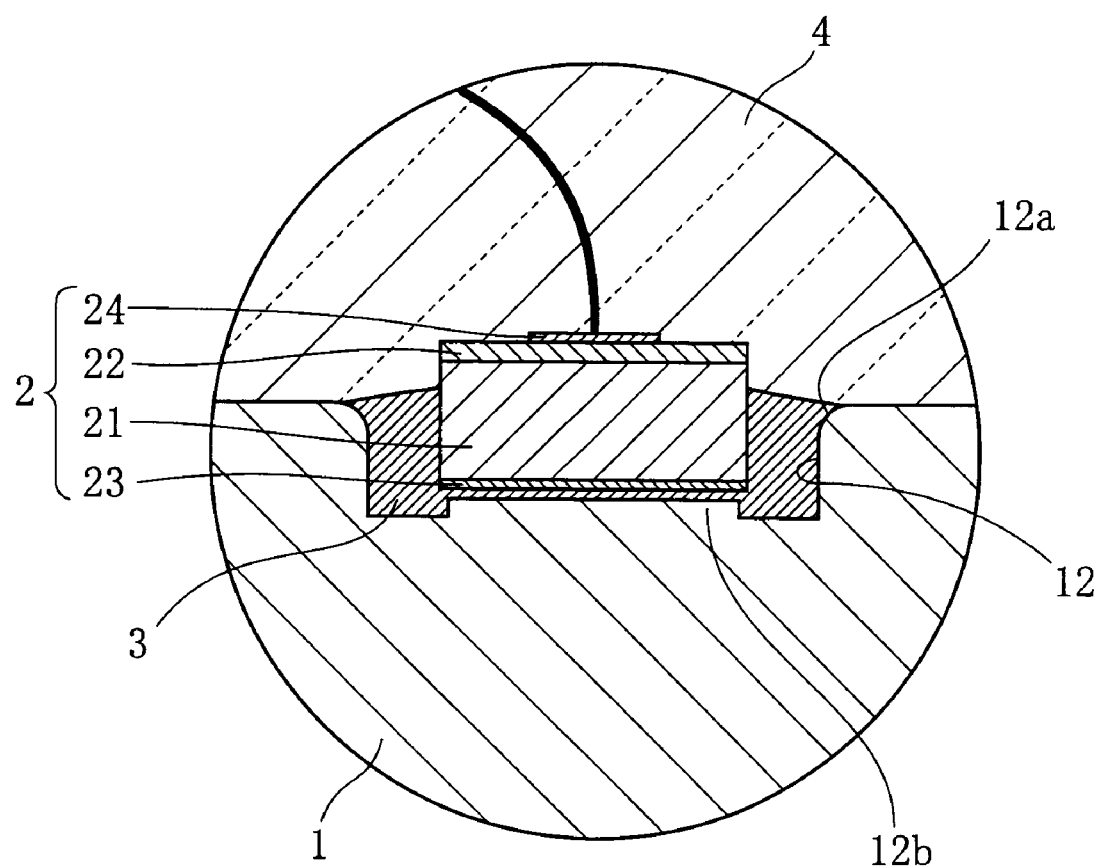
FIG. 4 is a sectional view illustrating a variation of the semiconductor light emitting device.
Figure 5:
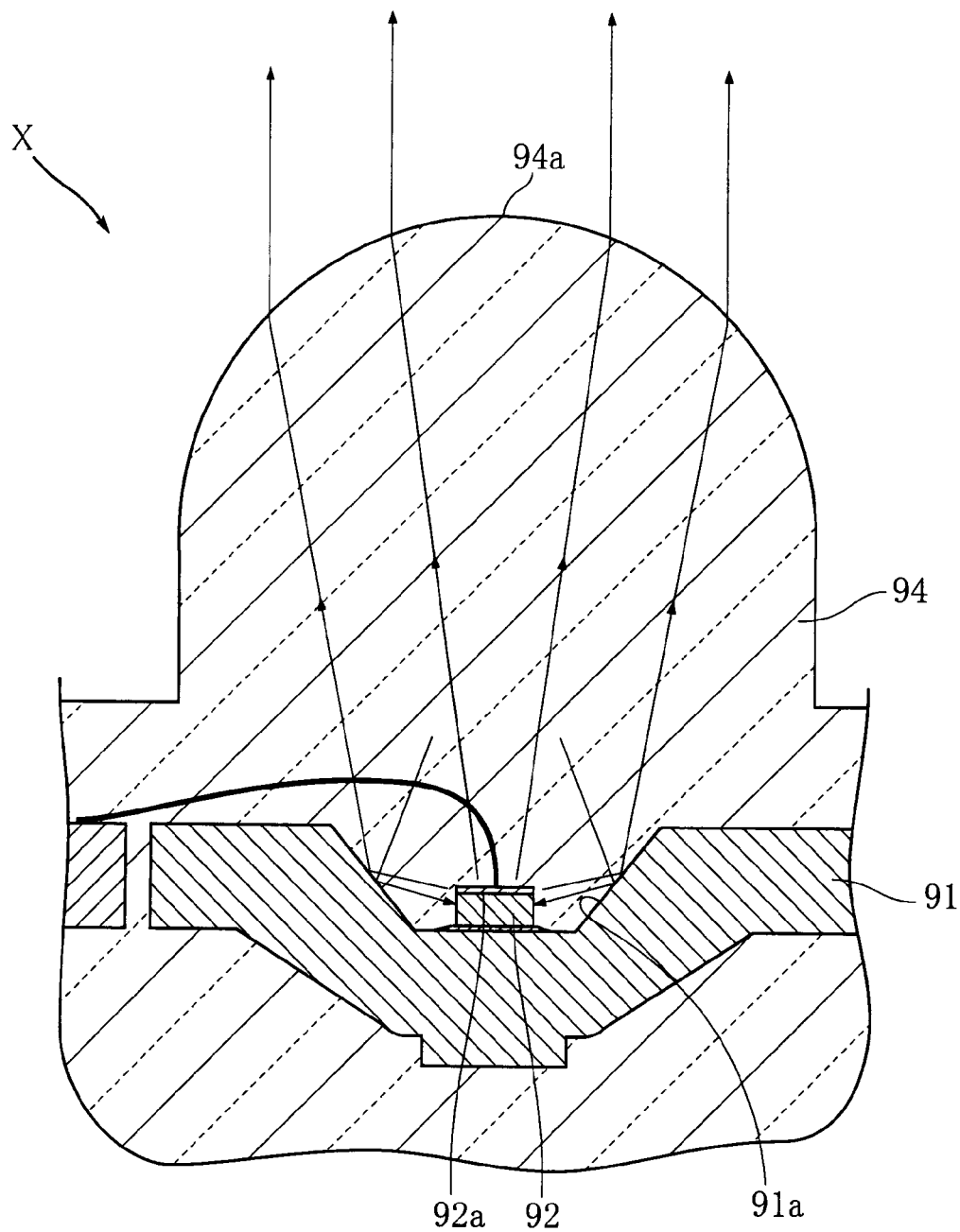
FIG. 5 is a sectional view illustrating an example of a conventional semiconductor light emitting device.

FIG. 4 illustrates a variation of the semiconductor light emitting device A. As illustrated in the figure, the tapered portion 12a of the semiconductor light emitting device A may be rounded instead of being a chamfer. The tapered portion 12a of this variation also reliably prevents the rising of the silver paste 3.

The semiconductor light emitting element to be employed in the present invention is not limited to one that emits red light. Light emitting elements that emit light of various wavelengths can be employed appropriately. The semiconductor light emitting element does not necessarily need to have electrodes on the obverse and the reverse surfaces. For instance, a semiconductor light emitting element having two electrodes on one surface may be employed instead. The silver paste described above is merely an example of highly heat conductive material. The heat dissipation from the semiconductor light emitting element can be achieved by employing any other materials having a thermal conductivity higher than that of the light transmitting resin.

The invention claimed is:

1. A semiconductor light emitting device comprising:
    a semiconductor light emitting element including a light emitting layer;
    a lead formed with a reflector surrounding the semiconductor light emitting element; and
    a light transmitting resin covering the semiconductor light emitting element, wherein;
    the lead includes a recess formed at a bottom surface of the reflector;
    the semiconductor light emitting element is mounted to a bottom surface of the recess, with the light emitting layer positioned outside the recess, and a highly heat conductive material having a thermal conductivity higher than that of the light transmitting resin is loaded between the semiconductor light emitting element and the recess;
    the bottom surface of the recess is formed with a raised portion projecting toward an open end of the recess; and
    the semiconductor light emitting element is mounted to the raised portion in a manner such that corners of a bottom surface of the semiconductor light emitting element are located outside of the raised portion.

2. The semiconductor light emitting device according to claim 1, wherein the recess includes a tapered open end whose diameter in cross section increases as proceeding away from the bottom surface of the recess.

3. The semiconductor light emitting device according to claim 2, wherein the open end is defined by a chamfer.

4. The semiconductor light emitting device according to claim 2, wherein the open end is rounded.

5. The semiconductor light emitting device according to claim 1, wherein the semiconductor light emitting element includes a lower electrode positioned at the bottom surface of the semiconductor light emitting element, and the highly heat conductive material is electrically conductive.

6. The semiconductor light emitting device according to claim 5, wherein the highly heat conductive material is silver paste.

7. The semiconductor light emitting device according to claim 1, wherein the light transmitting resin includes a lens positioned in front of the reflector.

8. The semiconductor light emitting device according to claim 1, wherein the raised portion includes a flat surface facing the semiconductor light emitting element.

9. A semiconductor light emitting device comprising:
   a semiconductor light emitting element including a light emitting layer;
   a reflector surrounding the semiconductor light emitting element; and
   a light transmitting resin covering the semiconductor light emitting element, wherein;
   the reflector includes a recess formed at a bottom surface thereof;
   the semiconductor light emitting element is mounted to a bottom surface of the recess, with the light emitting layer positioned outside the recess, and a highly heat conductive material having a thermal conductivity higher than that of the light transmitting resin is loaded between the semiconductor light emitting element and the recess;
   the bottom surface of the recess is formed with a raised portion projecting toward an open end of the recess; and
   the semiconductor light emitting element is mounted to the raised portion in a manner such that corners of a bottom surface of the semiconductor light emitting element are located outside of the raised portion.

10. The semiconductor light emitting device according to claim 9, wherein the recess includes a tapered open end whose diameter in cross section increases as proceeding away from the bottom surface of the recess.

11. The semiconductor light emitting device according to claim 9, wherein the semiconductor light emitting element includes a lower electrode positioned at the bottom surface of the semiconductor light emitting element, and the highly heat conductive material is electrically conductive.

12. The semiconductor light emitting device according to claim 11, wherein the highly heat conductive material is silver paste.

13. The semiconductor light emitting device according to claim 9, wherein the light transmitting resin includes a lens positioned in front of the reflector.

14. The semiconductor light emitting device according to claim 9, wherein the open end is defined by a chamfer.

15. The semiconductor light emitting device according to claim 9, wherein the open end is rounded.

16. The semiconductor light emitting device according to claim 9, wherein the raised portion includes a flat surface facing the semiconductor light emitting element.

* * * * *